United States Patent
Peng et al.

(10) Patent No.: US 7,294,009 B1
(45) Date of Patent: Nov. 13, 2007

(54) PRINTED CIRCUIT BOARD MODULE AND LOCKING APPARATUS THEREOF

(75) Inventors: Wen-Tang Peng, Tu-Cheng (TW); Jun-Xiong Zhang, Shenzhen (CN); Xin-Hu Gong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,773

(22) Filed: Sep. 22, 2006

(30) Foreign Application Priority Data

May 5, 2006 (CN) .......................... 2006 2 0058774

(51) Int. Cl.
*H01R 13/62* (2006.01)
(52) U.S. Cl. .......................................... 439/326; 439/64
(58) Field of Classification Search .................. 439/64, 439/79, 326, 328, 377; 361/752, 756
See application file for complete search history.

(56) References Cited

U.S. PATENT DOCUMENTS

| 5,191,514 | A |   | 3/1993 | Kabat et al. |
| 5,268,820 | A | * | 12/1993 | Tseng et al. ................. 361/785 |
| 6,234,820 | B1 | * | 5/2001 | Perino et al. ................ 439/326 |
| 6,603,669 | B2 | * | 8/2003 | Sheen et al. ................. 361/801 |
| 6,926,549 | B2 | * | 8/2005 | Wang ........................... 439/326 |
| 7,074,090 | B2 | * | 7/2006 | Ho et al. ...................... 439/630 |

* cited by examiner

*Primary Examiner*—Thanh-Tam Le
(74) *Attorney, Agent, or Firm*—Wei Te Chung

(57) ABSTRACT

A printed circuit board (PCB) module includes a motherboard, a sub-board, and a locking apparatus. The motherboard includes a first connector. The sub-board includes a second connector electrically coupled to the first connector. The locking apparatus includes a connecting portion and an elastic positioning portion arranged on the connecting portion. The connecting portion is detachably connected to the motherboard, and the sub-board is fixed on the motherboard by the elastic positioning portion.

15 Claims, 6 Drawing Sheets

PRINTED CIRCUIT BOARD MODULE AND LOCKING APPARATUS THEREOF

FIELD OF THE INVENTION

The present invention relates to printed circuit board (PCB) modules and locking apparatuses thereof, and particularly to a PCB module having two circuit boards and a locking apparatus for connecting the two circuit boards together.

DESCRIPTION OF RELATED ART

With the development of electronic technology, printed circuit cards, such as SATA (Serial Advanced Technology Attachment) hard disk drive interface cards, are now in widespread use. These printed circuit cards enable consumers to add extra functions to a PCB such as a motherboard. For example, when a SATA hard disk drive interface card is installed on a motherboard, the motherboard can be electrically coupled to a SATA hard disk drive via the interface card.

However, the SATA hard disk drive interface card is typically installed on the motherboard via screws or rivets. Thereby, when assembling/disassembling the printed circuit cards to/from the motherboard, it is unduly laborious and time-consuming.

What is desired, therefore, is to provide a locking apparatus which allows quick and convenient assembly/disassembly of a circuit board to/from another circuit board.

SUMMARY OF THE INVENTION

An exemplary printed circuit board (PCB) module includes a motherboard, a sub-board, and a locking apparatus. The motherboard includes a first connector. The sub-board includes a second connector electrically coupled to the first connector. The locking apparatus includes a connecting portion and an elastic positioning portion arranged on the connecting portion. The connecting portion is detachably connected to the motherboard, and the sub-board is fixed on the motherboard by the elastic positioning portion.

Other advantages and novel features will become more apparent from the following detailed description when taken in conjunction with the accompanying drawings, in which:

DETAILED DESCRIPTION OF THE INVENTION

Figure 1:
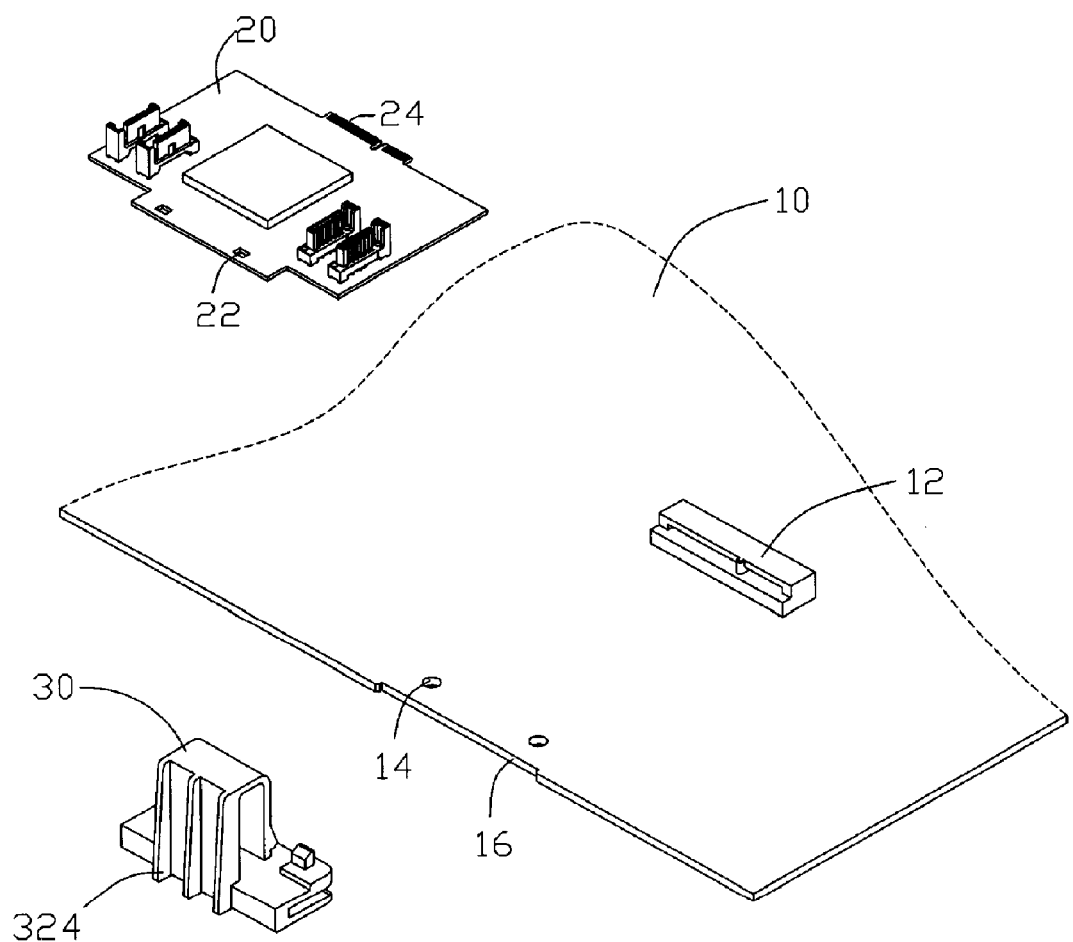
FIG. 1 is an exploded, isometric view of a PCB module in accordance with a preferred embodiment of the present invention, the PCB module includes a motherboard, a sub-board, and a locking apparatus.

Referring to FIG. 1, a printed circuit board (PCB) module in accordance with a first preferred embodiment of the present invention is shown. The PCB module includes a motherboard 10, a sub-board 20, and a locking apparatus 30 for connecting the motherboard 10 and the sub-board 20. For example, in the embodiment as shown in FIG. 1, the motherboard 10 is a computer motherboard and the sub-board 20 is a SATA (Serial Advanced Technology Attachment) hard disk drive interface card.

The motherboard 10 includes a first connector 12. A cutout 16 is defined in one edge of the motherboard 10. Two through holes 14 are defined in the motherboard 10 in the vicinity of the cutout 16. The sub-board 20 includes a second connector 24 at one edge thereof corresponding to the first connector 12. Two through holes 22 are defined in the sub-board 20 near an opposite edge of the sub-board corresponding to the two through holes 14 of the motherboard 10. An amount of through holes 14 and 22 can be arranged according to need.

Figure 2:
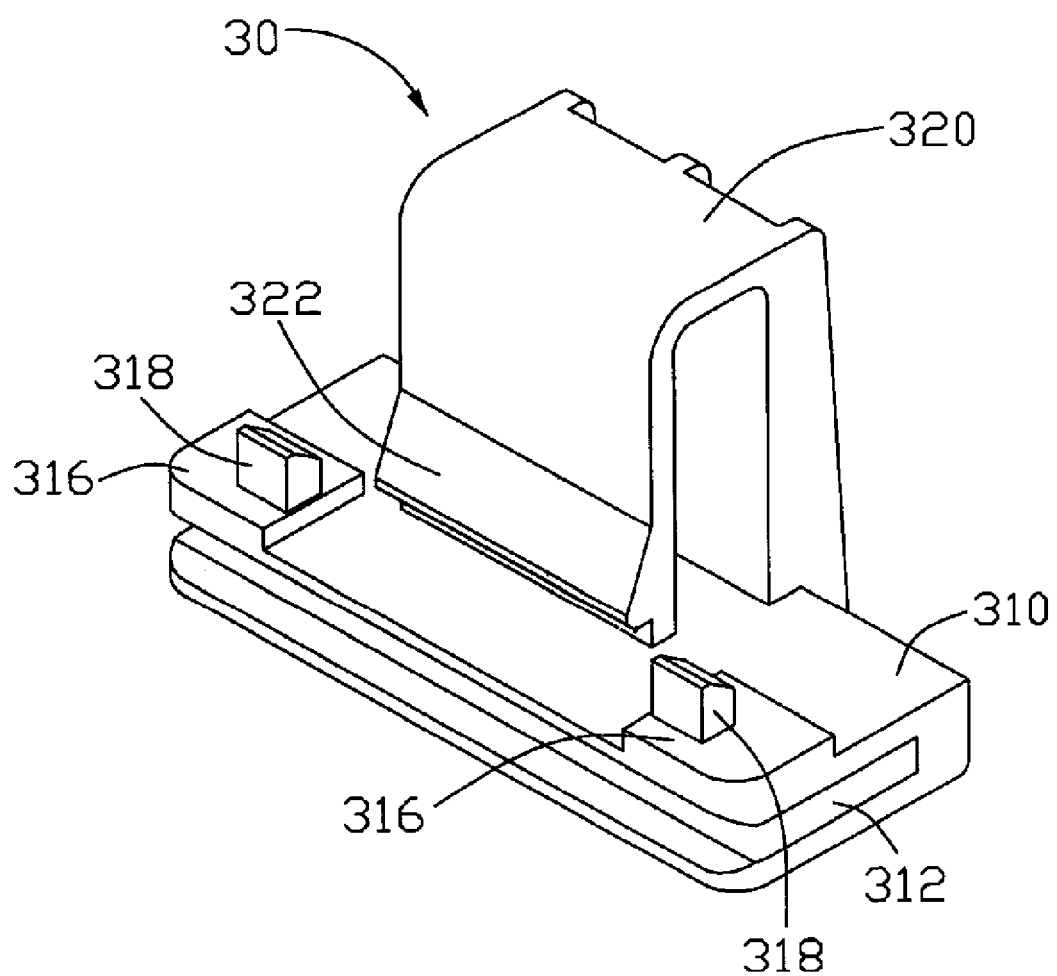
FIG. 2 is an enlarged view of the locking apparatus of FIG. 1.
Figure 3:
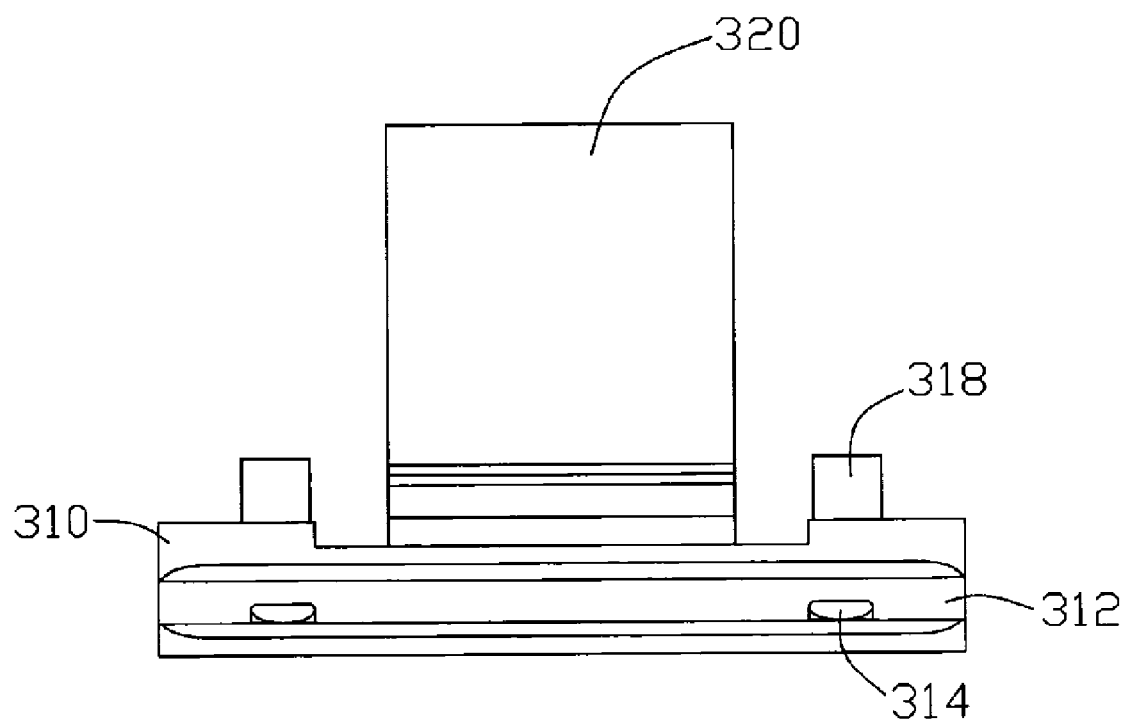
FIG. 3 is a front view of the locking apparatus of FIG. 2.
Figure 4:
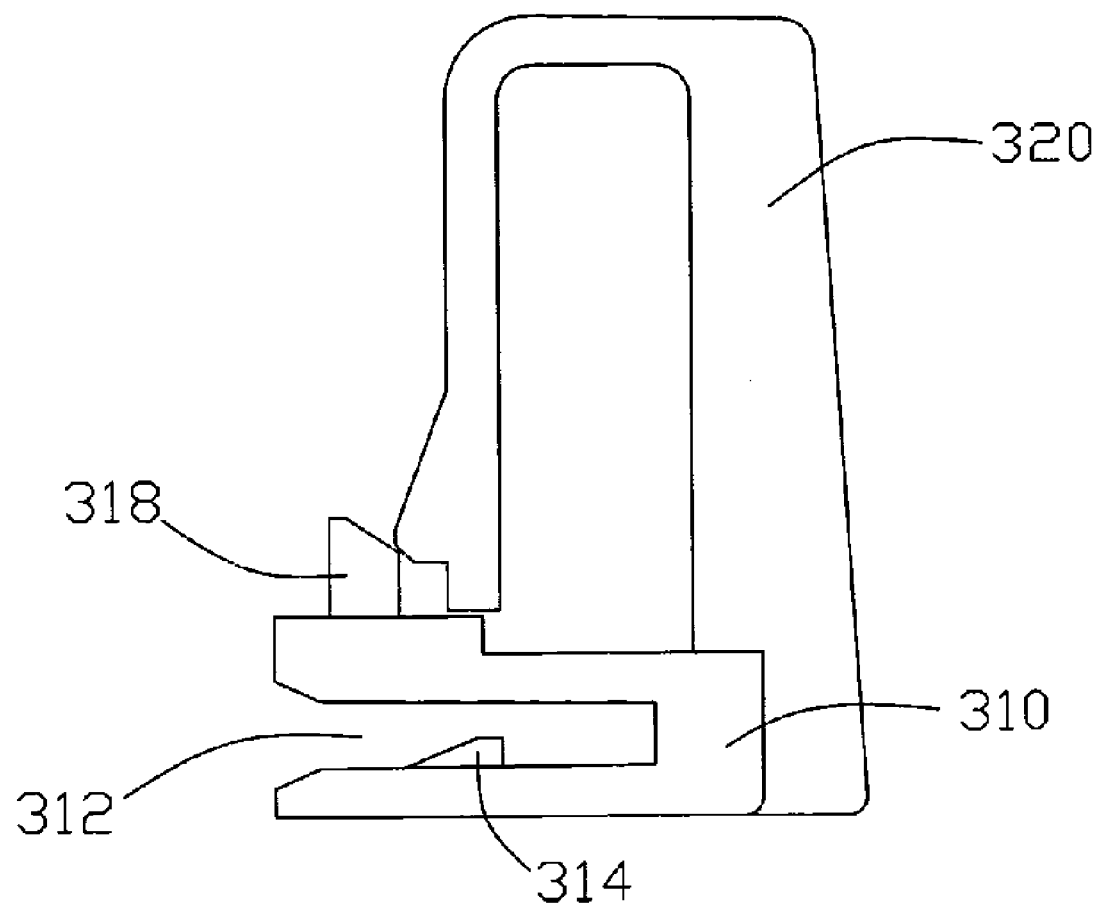
FIG. 4 is a right side view of the locking apparatus of FIG. 2.

Referring also to FIGS. 2 to 4, the locking apparatus 30 is integrally formed by plastic or other flexible materials, and includes a connecting portion 310 and an elastic positioning portion 320 extending from the connecting portion 310. A length of the connecting portion 310 matches a length of the cutout 16.

A latching slot 312 is defined in a front side of the connecting portion 310. Two positioning pins 314 extend from a bottom wall of the latching slot 312 corresponding to the through holes 14 of the motherboard 10. Each positioning pin 314 has an orthogonal trapezoid shape in cross section, and an inclined surface of each positioning pin 314 faces an opening of the latching slot 312. An upper surface of the connecting portion 310 includes two raised stages 316, and from each stage 316 a positioning block 318 extends up, corresponding to the through holes 22 of the sub-board 20.

The elastic positioning portion 320 is generally in a shape of an upside-down U-shape. The elastic positioning portion 320 includes a connecting plate connected to a rear side of the connecting portion 310, and a resilient distal portion terminating just above the connecting portion 310. A plurality of vertical reinforcing ribs 324 extends out from the connecting plate of the elastic positioning portion 320. A wedge-shaped block 322 is formed at the distal portion of the elastic positioning portion 320. An L-shaped step is formed at the bottommost of the block 322.

Figure 5:
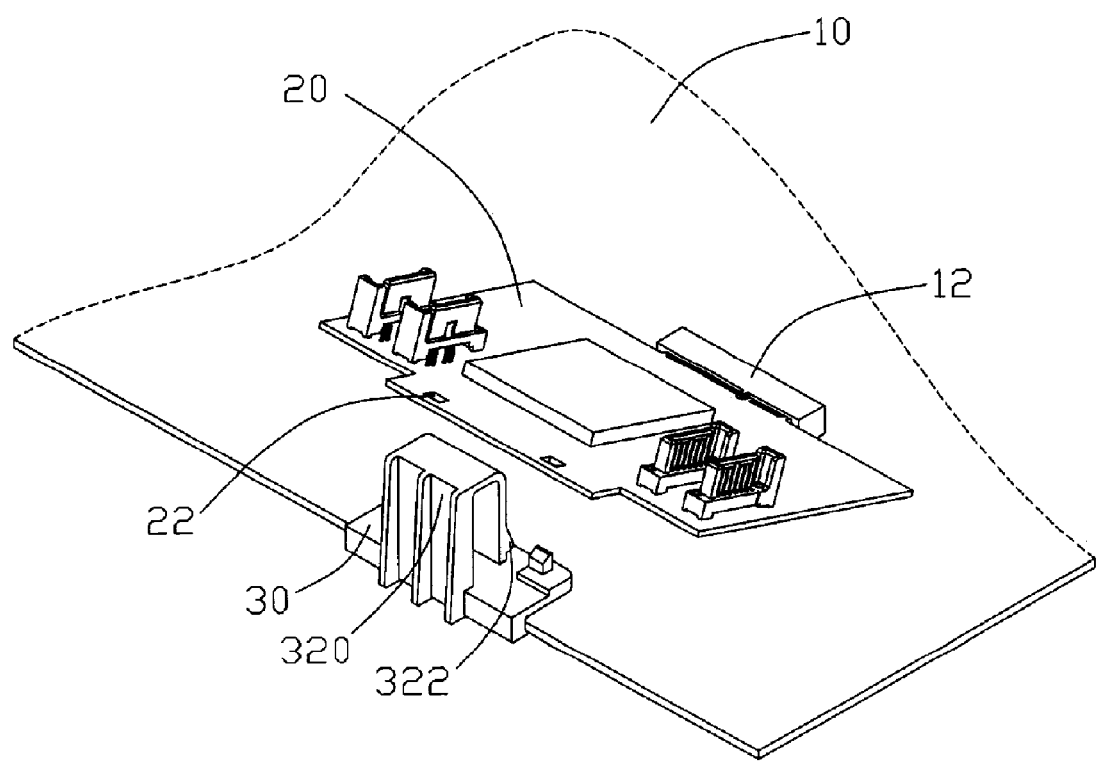
FIG. 5 is an assembling process view of FIG. 1.
Figure 6:
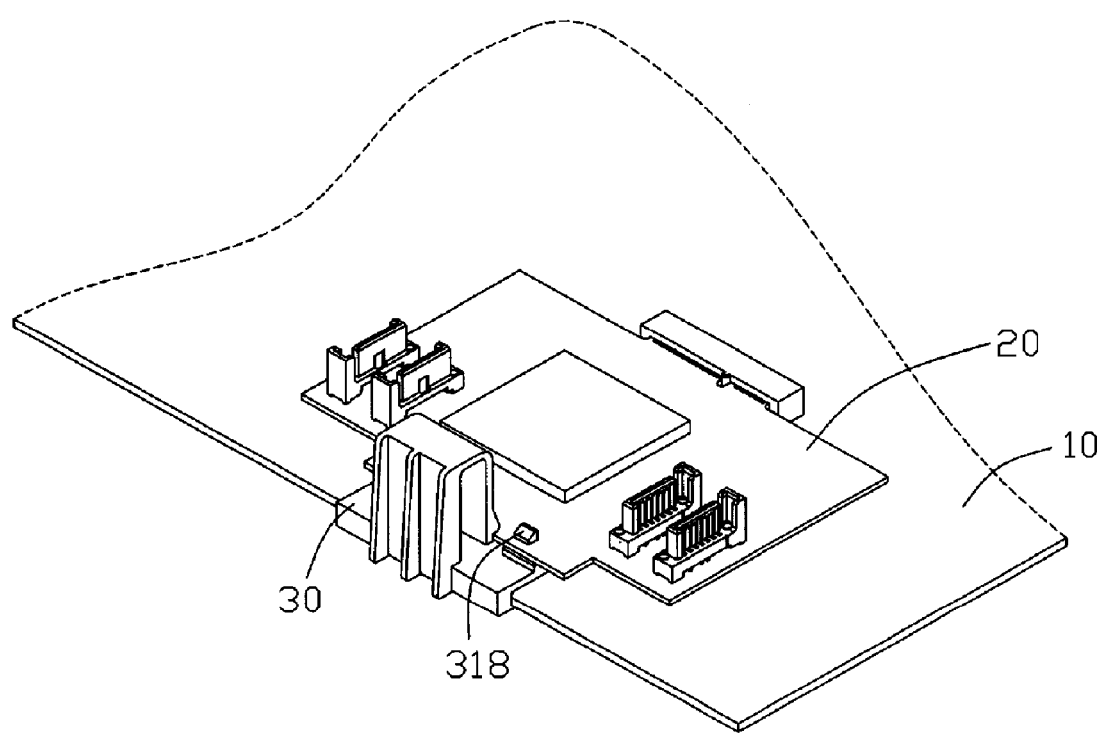
FIG. 6 is an assembled view of FIG. 1.

Referring also to FIGS. 5 and 6, in assembly, the portion at the one edge of the motherboard 10 defining the cutout 16 is received in the latching slot 312, and the positioning pins 314 snap into the through holes 14 of the motherboard 10, thereby securing the locking apparatus 30 to the motherboard 10. Further, the second connector 24 of the sub-board 20 is electrically coupled to the first connector 12 of the motherboard 10. Then, the opposite edge of the sub-board 20 is pushed down to the positioning portion 320, and the wedge-shaped block 322 of the positioning portion 320 is depressed by the opposite edge of the sub-board 20 so as to move the resilient plate of the elastic positioning portion 320, and then the opposite edge of the sub-board 20 rides over the wedge-shaped block 322. After that, the resilient plate of the elastic positioning portion 320 returns to its original position, and the opposite edge of the sub-board 20 is thus blocked by the wedge-shaped block 322 at the L-shaped step to thereby position the sub-board 20 in a vertical direction, and the positioning blocks 318 are received in the through holes 22 to position the sub-board 20 in a horizontal direction. Thus, the sub-board 20 is secured to the motherboard 10 by the locking apparatus 30.

In disassembly, the resilient plate of the elastic positioning portion 320 is pushed in a certain distance, and then the sub-board 20 can be easily taken out from the motherboard 10. The connecting portion 310 is pulled by hands of a user, so that the positioning pins 314 disengage from the corresponding through holes 14 of the motherboard 10, and then the locking apparatus 30 can be easily removed from the motherboard 10.

The locking apparatus 30 provides for removably assembling the motherboard 10 with the sub-board 20 without any tools so as to increase working efficiency. The locking apparatus 30 not only can connect the motherboard 10 with the sub-board 20, but also can easily connect any two circuit boards that need to be connected together.

It is to be understood, however, that even though numerous characteristics and advantages of the preferred embodiments have been set forth in the foregoing description, together with details of the structures and functions of the embodiments, the disclosure is illustrative only, and changes may be made in detail, especially in matters of shape, size, equivalent material and arrangement of parts within the principles of the invention to the full extent indicated by the broad general meaning of the terms in which the appended claims are expressed.

What is claimed is:

1. A printed circuit board (PCB) module comprising:
   a motherboard comprising a first connector;
   a sub-board comprising a second connector electrically coupled to the first connector; and
   a locking apparatus comprising a connecting portion and an elastic positioning portion arranged on the connecting portion, wherein the connecting portion of the locking apparatus defines a latching slot securely clasping one edge portion of the motherboard therein, the elastic positioning portion has a generally upside-down U-shape, the elastic positioning portion comprises a connecting plate connected to a rear side of the connecting portion, and a resilient distal portion terminating just above the connecting portion and engaging with the sub-board;
   wherein a plurality of reinforcing ribs extends out from the connecting plate of the elastic positioning portion.

2. The PCB module as claimed in claim 1, wherein the motherboard defines at least one through hole, at least one positioning pin extends from a bottom wall of the latching slot corresponding to the at least one through hole of the motherboard, the connecting portion is detachably connected to the motherboard.

3. The PCB module as claimed in claim 2, wherein the at least one positioning pin has an orthogonal trapezoid shape in cross section, and an inclined surface is formed on the at least one positioning pin facing an opening of the latching slot.

4. The PCB module as claimed in claim 1, wherein the motherboard further includes a cutout corresponding to the connecting portion, the latching slot of the connecting portion receives an edge of the motherboard at the cutout.

5. The PCB module as claimed in claim 1, wherein a wedge-shaped block extends out from the distal portion of the elastic positioning portion, to thereby from a step at the distal portion, the step engaging with one edge portion of the sub-board.

6. The PCB module as claimed in claim 1, wherein the sub-board defines at least one through hole, at least one positioning block extends from the connecting portion corresponding to the at least one through hole of the sub-board.

7. A locking apparatus for connecting two circuit boards, the locking apparatus comprising:
   a connecting portion configured for attaching to one of the two circuit boards; and
   an elastic positioning portion arranged on the connecting portion for fixing the other one of the two circuit boards onto the one of the two circuit boards, wherein the connecting portion defines a latching slot configured for clasping one edge portion of the one of the two circuit boards therein, at least one positioning block extends from the connecting portion configured for engaging with the other one of the two circuit boards, the elastic positioning portion having a resilient distal portion configured for pressing the other one of the two circuit boards to prevent the other one of the two circuit boards disengaging from the at least one positioning block;
   wherein the elastic positioning portion has a generally upside-down U-shape, the elastic positioning portion comprises a connecting plate connected to a rear side of the connecting portion, and a resilient distal portion terminating just above the connecting portion; and
   wherein a plurality of reinforcing ribs extends out from the connecting plate of the elastic positioning portion.

8. The locking apparatus as claimed in claim 7, wherein, at least one positioning pin extends from a bottom wall of the latching slot.

9. The locking apparatus as claimed in claim 8, wherein the at least one positioning pin has an orthogonal trapezoid shape in cross section, and an inclined surface is formed on the at least one positioning pin facing an opening of the latching slot.

10. The locking apparatus as claimed in claim 9, wherein a wedge-shaped block extends out from the distal portion of the elastic positioning portion to thereby form at the distal portion a step configured for engaging with the edge portion of the other one of the two circuit boards.

11. A printed circuit board (PCB) module comprising:
    a first circuit board comprising a first connector horizontally arranged thereon;
    a second circuit board comprising a second connector arranged at a first edge thereof to be electrically coupled to the first connector in a horizontal direction parallel to the second circuit board, and a second edge opposite to the first edge; and
    a locking apparatus comprising a connecting portion with a positioning member formed thereon and an elastic positioning portion extending from the connecting portion, the connecting portion attached to the first circuit board, wherein the positioning member engages with the second circuit board to position the second circuit board relative to the first circuit board in the horizontal direction and the elastic positioning portion engages with the second edge of the second circuit board to position the second circuit board relative to the first circuit board in a vertical direction perpendicular to the horizontal direction;
    wherein the elastic positioning portion has a generally upside-down U-shape, the elastic positioning portion comprises a connecting plate connected to a rear side of the connecting portion, and a resilient distal portion terminating just above the connecting portion; and
    wherein a plurality of reinforcing ribs extends out from the connecting plate of the elastic positioning portion.

12. The PCB module as claimed in claim 11, wherein the resilient free end portion comprises a wedge-shaped block with an L-shaped step engaging with an edge of the second circuit board.

13. The PCB module as claimed in claim 11, wherein the connecting portion defines a latching slot receiving said one edge portion of the first circuit, the positioning member is positioning block extending from the connecting portion in the second direction and engaging in a hole defined in the second circuit board.

14. The PCB module as claimed in claim 11, wherein at least one positioning pin extends from the connecting portion toward the latching slot and engaging with a hole defined in the first circuit board.

15. The PCB module as claimed in claim 11, wherein the first circuit board is a computer motherboard, and the second circuit board is a hard disk drive interface card.

* * * * *